(12) United States Patent
Abdulla et al.

(10) Patent No.: US 8,331,857 B2
(45) Date of Patent: Dec. 11, 2012

(54) WIRELESS INTERFACE TO PROGRAM PHASE-CHANGE MEMORIES

(75) Inventors: Mostafa Naguib Abdulla, Rancho Cordova, CA (US); Hari Giduturi, Folsom, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 441 days.

(21) Appl. No.: 12/465,506

(22) Filed: May 13, 2009

(65) Prior Publication Data

US 2010/0291867 A1    Nov. 18, 2010

(51) Int. Cl.
*H04B 5/00* (2006.01)
(52) U.S. Cl. .................. 455/41.1; 365/148; 365/163
(58) Field of Classification Search .............. 455/39–48, 455/59–90
See application file for complete search history.

(56) References Cited

U.S. PATENT DOCUMENTS

| | | | |
|---|---|---|---|
| 2009/0109738 A1* | 4/2009 | Donze et al. | 365/163 |
| 2009/0243813 A1* | 10/2009 | Smith et al. | 340/10.51 |
| 2010/0199150 A1* | 8/2010 | Shalvi et al. | 714/773 |
| 2010/0220509 A1* | 9/2010 | Sokolov et al. | 365/45 |
| 2010/0250849 A1* | 9/2010 | Eilert | 711/117 |
| 2010/0291867 A1* | 11/2010 | Abdulla et al. | 455/41.1 |
| 2010/0318718 A1* | 12/2010 | Eilert et al. | 711/103 |
| 2011/0128766 A1* | 6/2011 | Parkinson | 365/63 |

\* cited by examiner

*Primary Examiner* — Lincoln Donovan
*Assistant Examiner* — Brandon S Cole
(74) *Attorney, Agent, or Firm* — Schwegman, Lundberg & Woessner, P.A.

(57) ABSTRACT

A Phase-Change Memory (PCM) coupled to receive power provided by near-field coupling to operate the PCM and receive factory programming data entered through the antenna for storage in the PCM.

21 Claims, 1 Drawing Sheet

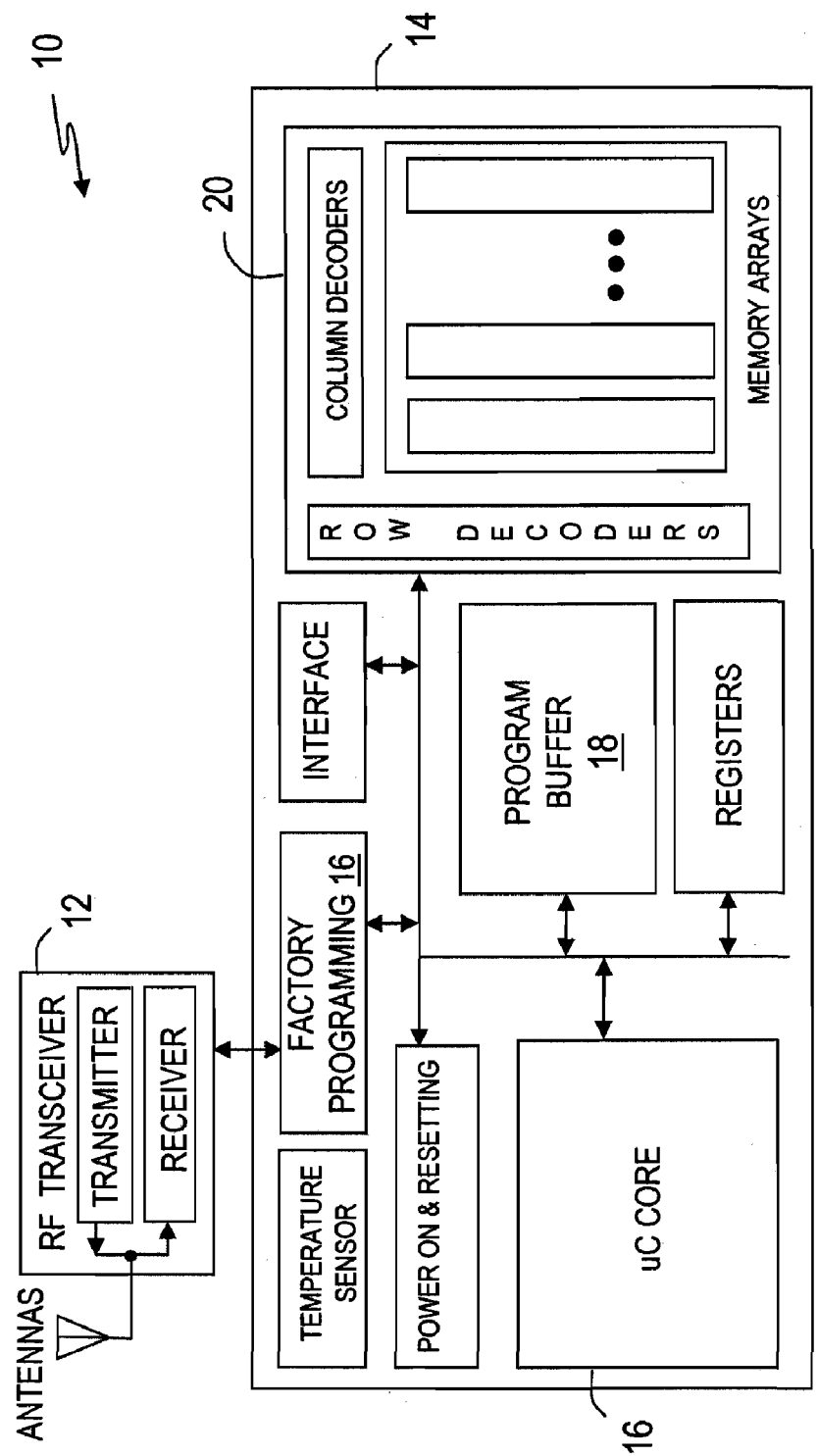

WIRELESS INTERFACE TO PROGRAM PHASE-CHANGE MEMORIES

BACKGROUND OF THE INVENTION

The Phase-Change Memory (PCM) technology is a promising alternative to the current nonvolatile memory mainstream constituted by the Flash technology. PCM manufacturing includes testing, packaging and soldering, referred to as back end processing. In testing, the phase change memory die may be tested to obtain chip configuration data, such as redundancy activation data and bad block management data. Configuration data obtained during testing may be stored in the phase change memory at test and retained over the life of the phase change memory device for normal operations. However, the back end processing may include temperatures of 175° C. or more, which may affect data retention of the phase change memory. Improvements are needed to ensure data retention of PCM devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

The sole FIGURE is a device that illustrates a wireless approach to accessing memory and receiving transmitted data for storage in a Phase-Change Memory (PCM) in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

The wireless architecture embodiment illustrated in FIG. 1 shows a system 10 that includes one or more memory devices 14 having a processor core 16 that communicates with an embedded storage array in accordance with the present invention. A single memory device may be coupled to a near-field antenna and receiver to transfer both power and wireless signals, or in another embodiment, multiple memory devices may be arranged in a die-stacking module to receive power and near-field communication signals. System 10 may include one or more antennas to allow a radio to program the memory arrays using over-the-air communication signals.

The use of near-field magnetic coupling may include a coil contained in a charging base that creates a magnetic field, while small coils are built into each memory device 14. In one embodiment the small coils may be molded into plastic housings, eliminating the need to attach an external component. Various embodiments of the invention pertain to using radio frequency wireless signals in near-field to program a nonvolatile memory, with the power received through an antenna being used to provide the operating power to the non-volatile memory and to the circuitry associated with its programming.

The radio subsystems collocated in the same platform of system 10 provide the capability of communicating effectively across a short distance in a location space with other devices in a network. The near-field magnetic technology eliminates the need for direct electrical contact and provides positioning choices of the memory device to the charging pad. Also, the memory devices do not need to establish perfect alignment to the charging pad. The receiver in transceiver 12 receives types of energy wirelessly that are collected, converted or transformed into a power useable by memory device 14. The receiver may use a power harvester connected to the point of reception for converting the energy types into usable energy.

Memory device 14 includes multiple banks of a Phase-Change Memory (PCM) 20 to provide flexibility for splitting the code and data spaces within the memory arrays. The PCM arrays may also be referred to as Phase-Change Random Access Memory (PRAM or PCRAM), Ovonic Unified Memory (OUM) or Chalcogenide Random Access Memory (C-RAM). The arrays of PCM cells include alloys of elements of group VI of the periodic table, elements such as Te or Se that are referred to as chalcogenides or chalcogenic materials.

When the memory arrays use chalcogenides advantageously in phase change memory cells to provide data retention, the data remains stable even after the power is removed from the nonvolatile memory. Taking the phase change material as $Ge_2Sb_2Te_5$ for example, two phases or more are exhibited having distinct electrical characteristics useful for memory storage.

The chalcogenide chemistry uses the application of heat to melt the material for the two energy states for any particular bit. However, the high energy bands of the phase change material may bring about instability in the retention of data when the memory device is subjected to external heat. For example, the high resistance amorphous state has sufficient activation energy as to be susceptible to relaxation into the crystalline state with the application of external heat, resulting in a loss of data. One possibility for operation induced retention failure may be a change in stoichiometry of the cell chemistry. With sufficient external thermal energy applied, it is possible for a chalcogenide memory device to change characteristics and loose stored data.

This loss of stored data is problematic for a phase-change memory device. The boot code for operating the uC that normally resides in the nonvolatile memory is not reliable and no longer available in a PCM device. Options for obtaining a new boot code may include storing that code in an embedded non-PCM nonvolatile memory or uploading a new code to the system RAM through an interface. The task of uploading a new boot code is unique for each board design and uC type. After installation of the boot code, in-factory programming data may then be transferred to the PCM device via the wireless interface on the PCM device.

The present embodiment describes circuitry and methods that may be used to overcome heat related, data retention problems by programming the PCM devices following the backend manufacturing process. Accordingly, these techniques may be incorporated to properly transfer data into system 10 for storage in PCM devices. In addition to loading boot code, chip configuration data such as product identification (product ID), redundancy activation data and bad block management data may be loaded into memory device 14. The configuration data may be stored in the phase change memory at test using receiver 12 to stream factory programming data into memory device 14. Configuration data obtained during testing needs to be retained in the phase change memory over the life of the phase change memory device for normal operations.

A memory programming algorithm receives the stream data, automatically increments its address, and sets up PCM arrays 20 to store ECC verified factory programming data. Thus, memory device 14 may execute commands to receive over-the-air factory programming data via receiver 12 into factory programming block 16 for storage in PCM arrays 20 following the heat cycles that occur during the backend packaging operation. Irrespective of any heat effects to data values in storage locations in the PCM device during the backend process, receiver 12 delivers over-the-air data that may be used to properly install a boot code and factory programming data, among other data types, into the PCM arrays 20 in memory device 14.

By now it should be apparent that embodiments of the present invention allow increased memory storage efficiencies by using features, either singularly or in combination, that allow data to be entered reliably into the PCM memory device. The temperatures experienced in backend manufacturing processes may invalidate data stored within memory device 14, but the wireless interface provides a method of uploading a new boot code and transferring data into PCM storage. These methods, circuitry, and techniques allow factory programming to be reliably utilized for chalcogenide PCM devices.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A memory device, comprising:
a program module;
Phase-Change Memory (PCM) data arrays; and
a near-field interface to the memory device to receive through a near-field antenna both data for storage in the PCM data arrays and operating power to operate the memory device, wherein the near-field interface is deactivated after receiving factory programming.

2. The memory device of claim 1, wherein the data downloaded to the memory device includes a boot code.

3. The memory device of claim 1, wherein the data downloaded to the memory device includes a product identification.

4. The memory device of claim 1, wherein the data is factory program data that includes bad block management data determined in back end processing of the memory device.

5. The memory device of claim 1, wherein the near-field interface provides bi-directional communication from test equipment through the antenna in the memory device.

6. The memory device of claim 1, wherein
the antenna is coupled to a receiver to provide near-field coupling with power received through the antenna being used to provide the operating power to the PCM data arrays and to circuitry associated with programming.

7. A memory device, comprising:
Phase-Change Memory (PCM) storage;
a receiver;
an antenna coupled to the receiver to provide near-field coupling with power received through the antenna providing both an operating power to the memory device and data for storage in the PCM storage and
a near-field interface embedded with the memory device to receive data during a backend process to program the PCM storage, wherein the near-field interface is deactivated after receiving factory programming.

8. The memory device of claim 7, wherein the data includes bad block management data determined in a test during the backend process.

9. The memory device of claim 7, wherein the data includes redundancy activation data.

10. A system to program a Phase-Change Memory (PCM) device, comprising:
a factory device to provide chip configuration data; and
an antenna embedded within the PCM device in a near-field interface to provide both power to operate the PCM device and the chip configuration data for storage in the PCM device, wherein the factory device is configured to stream the chip configuration data through the antenna for storage in the PCM device, wherein the near-field interface is configured to be deactivated after receiving the chip configuration data.

11. The system of claim 10, wherein the near-field interface provides bi-directional communication from the factory device through the antenna in the PCM device.

12. The system of claim 10 wherein the chip configuration data includes a product identification, redundancy activation data and bad block management data.

13. The system of claim 10 wherein the PCM device includes a factory programming module to handle streaming the chip configuration data.

14. A memory device, comprising:
a Phase-Change Memory (PCM) having an near-field interface coupling to provide operating power to the PCM, wherein factory chip configuration data is entered through an antenna for storage in the PCM, wherein operating power to operate the PCM is provided through the antenna, and wherein the near-field interface is configured to be deactivated after receiving the factory chip configuration data.

15. The memory device of claim 14, wherein the factory chip configuration data is programmed into the PCM and includes a product identification.

16. The memory device of claim 14, wherein the factory chip configuration data includes redundancy activation data.

17. The memory device of claim 14, wherein the factory chip configuration data includes bad block management data.

18. The memory device of claim 14, wherein the PCM includes a mode register to place the PCM in an operating mode to receive the factory chip configuration data and deactivates the near-field following factory programming.

19. A memory device comprising:
a Phase-Change Memory (PCM); and an near-field interface to wirelessly receive from a near-field antenna both data for storage in the PCM and operating power to operate the memory device, wherein the near-field interface is deactivated after receiving factory programming.

20. The memory device of claim 19, wherein a receiver coupled to the antenna is configured to receive energy from a charging base that includes a first coil for creating a magnetic field, wherein the receiver is configured to convert the energy into the operating power, and wherein a transmitter coupled to the antenna is configured to transmit the data and the operating power to the PCM.

21. The memory device of claim 20, further comprising a second coil molded into the memory device.

* * * * *